United States Patent
Liu et al.

(10) Patent No.: US 9,093,641 B2
(45) Date of Patent: Jul. 28, 2015

(54) METHODS OF FORMING MEMORY CELLS, AND METHODS OF PATTERNING CHALCOGENIDE-CONTAINING STACKS

(71) Applicant: Micron Technology, Inc., Boise, ID (US)

(72) Inventors: Jun Liu, Boise, ID (US); Jerome Imonigie, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 81 days.

(21) Appl. No.: 13/761,609

(22) Filed: Feb. 7, 2013

(65) Prior Publication Data

US 2013/0149834 A1    Jun. 13, 2013

Related U.S. Application Data (63) Continuation of application No. 12/836,476, filed on Jul. 14, 2010, now Pat. No. 8,394,667.

(51) Int. Cl.
*H01L 21/311* (2006.01)
*H01L 45/00* (2006.01)

(52) U.S. Cl.
CPC ............ *H01L 45/1675* (2013.01); *H01L 45/06* (2013.01); *H01L 45/144* (2013.01)

(58) Field of Classification Search
CPC ... H01L 45/06; H01L 45/1675; H01L 45/143; H01L 45/141; H01L 45/144
USPC ........... 438/381, 706, 737, 696; 257/E21.068
See application file for complete search history.

(56) References Cited

U.S. PATENT DOCUMENTS

| | | | |
|---|---|---|---|
| 5,702,869 A | 12/1997 | Chien et al. | |
| 6,207,588 B1 | 3/2001 | Choi et al. | |
| 6,713,402 B2 | 3/2004 | Smith et al. | |
| 7,005,665 B2 | 2/2006 | Furkay et al. | |
| 7,511,984 B2 | 3/2009 | Liu | |
| 7,628,967 B2 * | 12/2009 | Johnson | 423/239.1 |
| 7,663,137 B2 | 2/2010 | Campbell | |
| 7,667,220 B2 | 2/2010 | Ho et al. | |
| 7,729,163 B2 | 6/2010 | Ramani et al. | |
| 2003/0181055 A1 | 9/2003 | Wu et al. | |
| 2006/0099822 A1 | 5/2006 | Harshfield et al. | |
| 2007/0158698 A1 * | 7/2007 | Dennison et al. | 257/246 |
| 2007/0235712 A1 | 10/2007 | Harshfield et al. | |
| 2009/0246964 A1 * | 10/2009 | Cheng et al. | 438/710 |
| 2010/0018553 A1 | 1/2010 | Mikhaylichenko et al. | |
| 2010/0051893 A1 | 3/2010 | Kim et al. | |
| 2012/0220099 A1 * | 8/2012 | Dennison | 438/381 |

* cited by examiner

*Primary Examiner* — William F Kraig
*Assistant Examiner* — Nga Doan
(74) *Attorney, Agent, or Firm* — Wells St. John P.S.

(57) ABSTRACT

Some embodiments include methods of forming memory cells. Chalcogenide is formed over a plurality of bottom electrodes, and top electrode material is formed over the chalcogenide. Sacrificial material is formed over the top electrode material. A plurality of memory cell structures is formed by etching through the sacrificial material, top electrode material and chalcogenide. Each of the memory cell structures has a cap of the sacrificial material thereover. The etching forms polymeric residue over the sacrificial material caps, and damages chalcogenide along sidewalls of the structures. The sacrificial material is removed with an HF-containing solution, and such removes the polymeric residue off of the memory cell structures. After the sacrificial material is removed, the sidewalls of the structures are treated with one or both of $H_2O_2$ and $HNO_3$ to remove damaged chalcogenide from the sidewalls of the memory cell structures.

7 Claims, 7 Drawing Sheets

METHODS OF FORMING MEMORY CELLS, AND METHODS OF PATTERNING CHALCOGENIDE-CONTAINING STACKS

RELATED PATENT DATA

This patent resulted from a continuation of U.S. patent application Ser. No. 12/836,476, which was filed Jul. 14, 2010, and which is hereby incorporated herein by reference.

TECHNICAL FIELD

Methods of forming memory cells, and methods of patterning chalcogenide-containing stacks.

BACKGROUND

Nonvolatile memories can be important elements of integrated circuits due to their ability to maintain data absent a power supply. Phase change materials have been investigated for use in nonvolatile memory cells. Memory cells containing phase change materials are often referred to as phase change memory cells. The phase change memory cells may be incorporated into random access memory (RAM). Such memory may be referred to as phase change RAM (PCRAM).

Chalcogenide materials have been of particular interest for utilization in PCRAM. Chalcogenide materials are capable of stably transitioning between amorphous and crystalline phases. Each phase can exhibit a particular resistance state. Specifically, an amorphous state exhibits a relatively high resistance, and a crystalline state exhibits a relatively low resistance. The different resistance states can be used to represent the logic values of the memory cell.

Although chalcogenide materials show promise for utilization in nonvolatile memory cells, there are often difficulties encountered in attempting to incorporate the chalcogenide materials into integrated circuitry. Accordingly, it would be desired to develop improved methods for fabrication of memory cells containing chalcogenide materials.

DETAILED DESCRIPTION OF THE ILLUSTRATED EMBODIMENTS

Some embodiments include cleaning methods for removing polymer and/or damage regions during fabrication of phase change memory cells. Example embodiments are described with reference to FIGS. 1-7.

Figure 1:
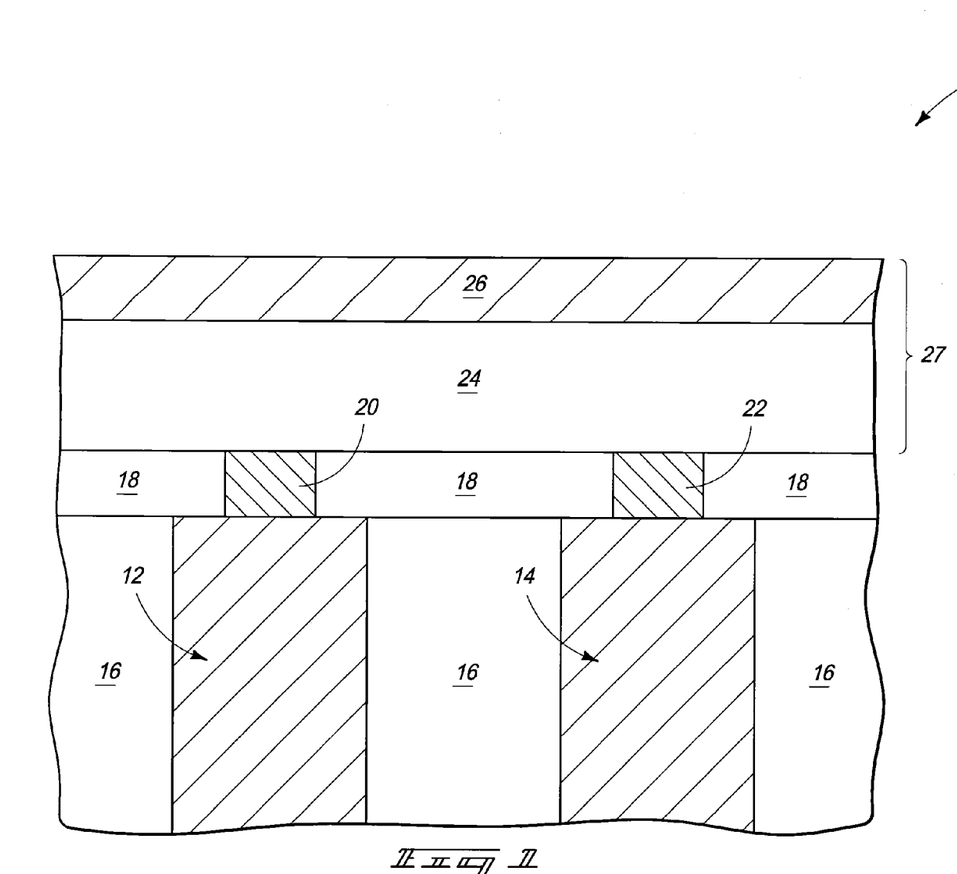
FIGS. 1-7 are diagrammatic cross-sectional views of a portion of a semiconductor construction shown at various process stages of an example embodiment method of the present invention.

Referring to FIG. 1, a construction 10 is shown at a processing stage of an example embodiment method for forming phase change memory cells. Construction 10 comprises a pair of electrical interconnects 12 and 14 extending through an electrically insulative material 16.

The electrical interconnects 12 and 14 may comprise any suitable electrically conductive composition, or combination of compositions; and in some embodiments may comprise, consist essentially of, or consist of one or more of various metals (for instance, tungsten, titanium, platinum, ruthenium, etc.), metal-containing compounds (for instance, metal silicides, metal nitrides, etc.), and conductively-doped semiconductor materials (for instance, conductively-doped silicon, conductively-doped germanium, etc.).

The electrically insulative material 16 may comprise any suitable composition or combination of compositions; and in some embodiments may comprise one or more of silicon dioxide, silicon nitride, borophosphosilicate glass (BPSG), phosphosilicate glass (PSG), fluorosilicate glass (FSG), etc.

An electrically insulative material 18 is over material 16, and over interconnects 12 and 14. The electrically insulative 18 may comprise any suitable composition or combination of compositions, and in some embodiments may comprise, consist essentially of, or consist of silicon nitride. Such silicon nitride may be formed by one or both of atomic layer deposition (ALD) and chemical vapor deposition (CVD), and may be formed at a process temperature greater than 300° C. so that it is a "high-quality" silicon nitride.

Bottom electrodes 20 and 22 extend through insulative material 18 to electrically connect with the electrical interconnects 12 and 14. The bottom electrodes may comprise any suitable electrically conductive composition, or combination of compositions; and in some embodiments may comprise, consist essentially of, or consist of one or more of various metals (for instance, tungsten, titanium, platinum, ruthenium, etc.), metal-containing compounds (for instance, metal silicides, metal nitrides, etc.), and conductively-doped semiconductor materials (for instance, conductively-doped silicon, conductively-doped germanium, etc.).

Although two bottom electrodes are shown, in practice there may be many more than two bottom electrodes at the processing stage of FIG. 1. Ultimately, each bottom electrode will be incorporated into a memory cell.

Phase change material 24 is formed over the bottom electrodes 20 and 22, and over the insulative material 18 between such bottom electrodes. In some embodiments material 24 will comprise, consist essentially of, or consist of chalcogenide. Example chalcogenides are materials comprising germanium (Ge) and antimony (Sb), which can be denoted with the shorthand GS. Other example chalcogenides are materials comprising Ge, Sb and tellurium (Te), which can be denoted with the shorthand GST. A specific chalcogenide that may be utilized in some embodiments is $Ge_2Sb_2Te_5$.

A top electrode material 26 is formed over phase change material 24. The top electrode material may comprise any suitable electrically conductive composition, or combination of compositions; and in some embodiments may comprise, consist essentially of, or consist of one or more of various metals (for instance, tungsten, titanium, platinum, ruthenium, etc.), metal-containing compounds (for instance, metal silicides, metal nitrides, etc.), and conductively-doped semiconductor materials (for instance, conductively-doped silicon, conductively-doped germanium, etc.). In particular applications the top electrode material may comprise, consist essentially of, or consist of tungsten.

The phase change material 24 and top electrode material 26 together form a stack 27. In embodiments in which the phase change material comprises chalcogenide, the stack may be referred to as a chalcogenide-containing stack.

In some embodiments the shown construction 10 may be supported by a semiconductor wafer (for instance, a monocrystalline silicon wafer). Constructions which include semiconductor material may be referred to as semiconductor constructions or semiconductor substrates. The terms "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Figure 2:
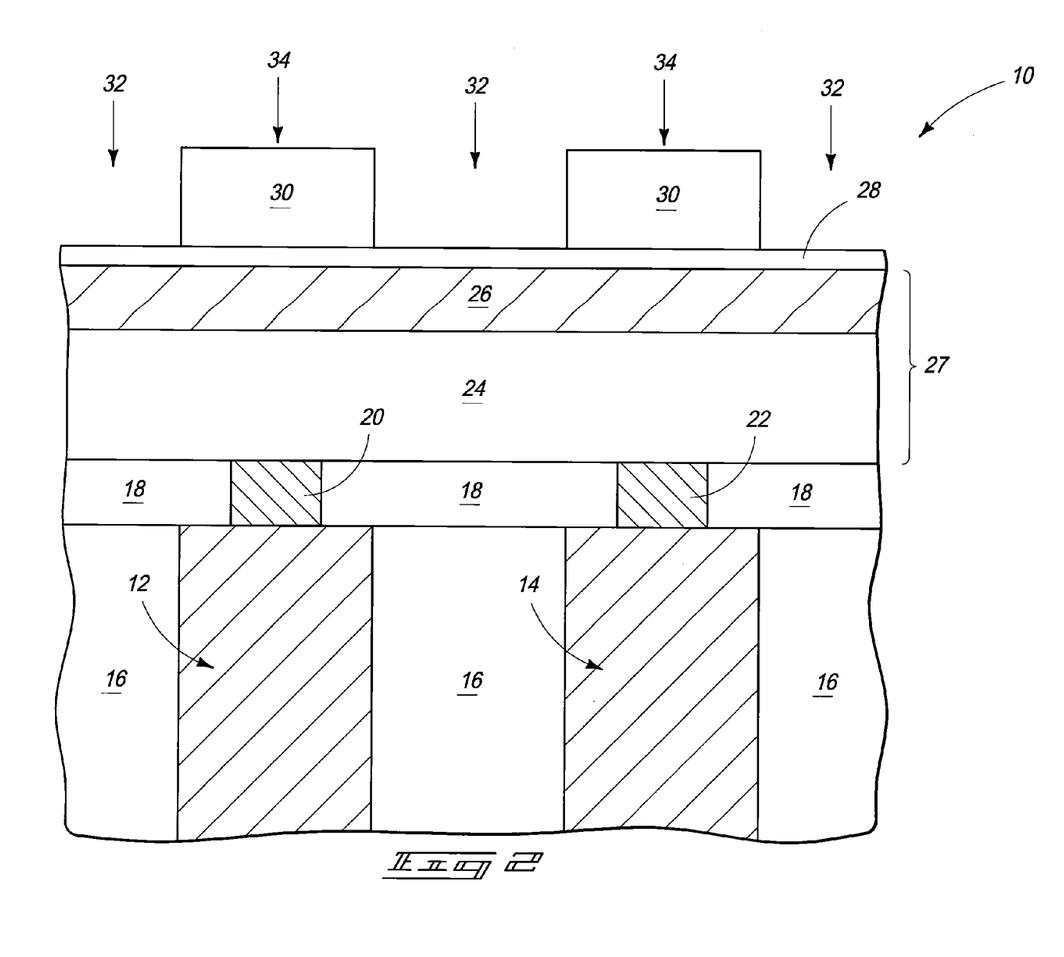

Referring to FIG. 2, a sacrificial material 28 is formed over top electrode material 26. The sacrificial material may comprise any suitable composition or combination of compositions. In some embodiments the sacrificial material 28 may comprise, consist essentially of, or consist of silicon nitride. Such silicon nitride may be formed by ALD or CVD (for instance, plasma-enhanced CVD) at a temperature of less than or equal to about 300° C. (for instance, a temperature of about 250° C.). Silicon nitride formed at temperatures less than or equal to 300° C. are often considered "low quality" nitrides because of their poor quality for use as insulative materials. However, such "low quality" silicon nitrides may be easier to remove than silicon nitrides formed at higher temperatures. Relatively easy removal can be a desired attribute of sacrificial material 28 in some of the embodiments described herein.

A patterned masking material 30 is formed over sacrificial material 28. In some embodiments material 30 may correspond to photolithographically-patterned photoresist. The masking material 30 comprises features 34, and is patterned to have a plurality of openings 32 extending between the features. The features 34 define memory cell locations, and specifically define locations where memory cell structures will be formed from the phase change material 24 and the top electrode material 26 of stack 27.

Figure 3:
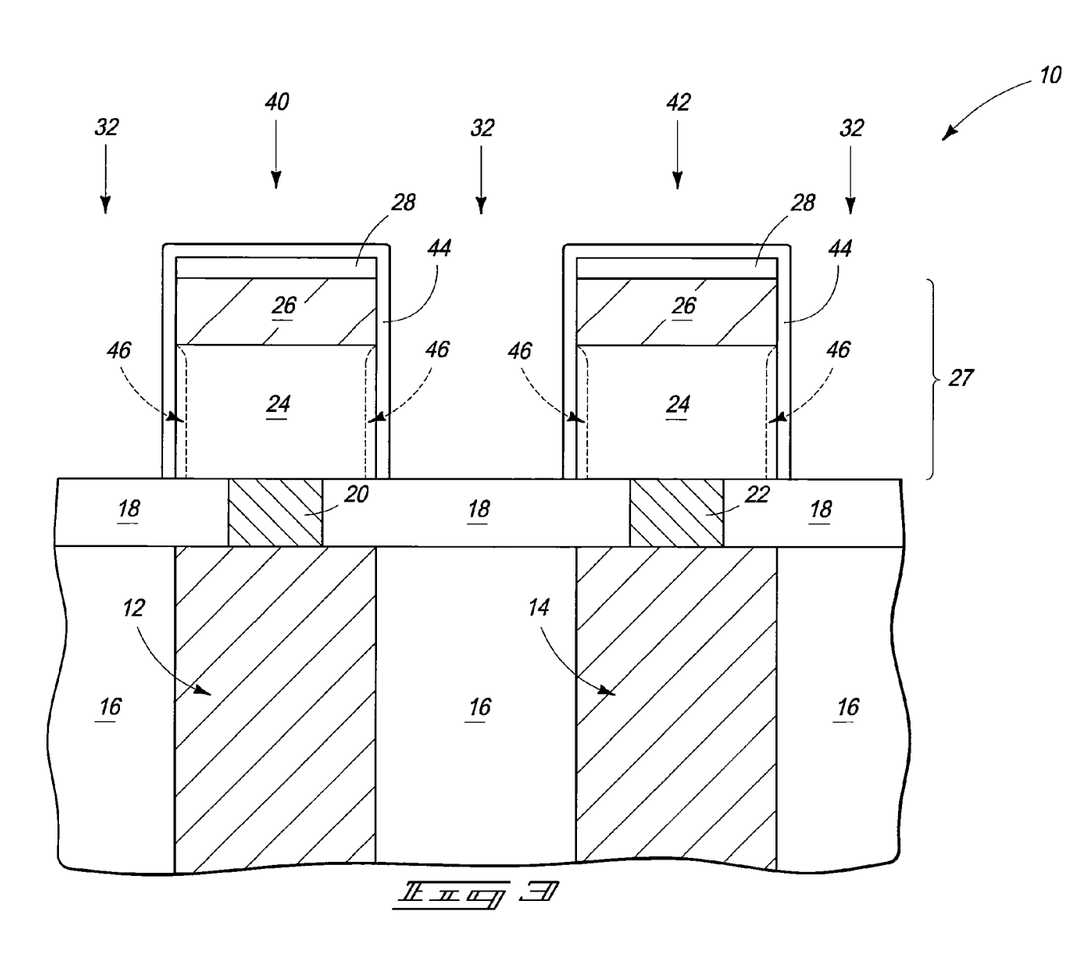

Referring to FIG. 3, openings 32 are extended through the sacrificial material 28 and the stack 27 with one or more suitable etches, and the masking material 30 (FIG. 2) is removed. The etching through the phase change material 24 and the top electrode material 26 of the stack 27 patterns the stack into spaced apart memory cell structures 40 and 42. Each of such structures has a cap of the sacrificial material 28 thereover.

In some embodiments the etching through materials 24, 26 and 28 may utilize a dry etch comprising one or more plasma sources containing halogen elements (such as, $Cl_2$, HBr, $CF_4$, etc.), and the removal of masking material 30 may comprise an $O_2$ or $NH_3$-containing strip of a photoresist mask.

The etching through materials 24, 26 and 28, and/or the $O_2$ strip of the photoresist mask may create polymeric residues 44 that extend along sidewalls of materials 24 and 26, and across the top of sacrificial material 28. Additionally, the etching and/or the $O_2$ strip may create damage regions 46 along sidewalls of phase change material 24. The damage regions may correspond to, for example, regions where the chemical composition of a chalcogenide is altered, and/or regions where physical characteristics of a chalcogenide are altered.

A problem encountered in prior art processing is that the polymeric residues 44 may not be adequately removed during a fabrication process, and may thus interfere with subsequent process stages. Another problem encountered in prior art processing is that the damage regions 46 are ignored or unrecognized, and not appropriately treated. This can also interfere with subsequent process stages, and can ultimately lead to device failure.

An aspect of some embodiments is utilization of improved cleaning procedures for removing the polymeric material 44. Another aspect of some embodiments is utilization of improved procedures for treating the damage regions 46.

The sacrificial material 28 is not utilized in prior art processes, but is provided in the embodiment of FIG. 3 in order to enable the polymeric material 44 to be lifted off from the structures 40 and 42. Specifically, sacrificial material 28 may be formed of a composition that is readily removed, and the removal of such composition will simultaneously lift the polymeric material 44 off from the tops of structures 40 and 42.

Figure 4:
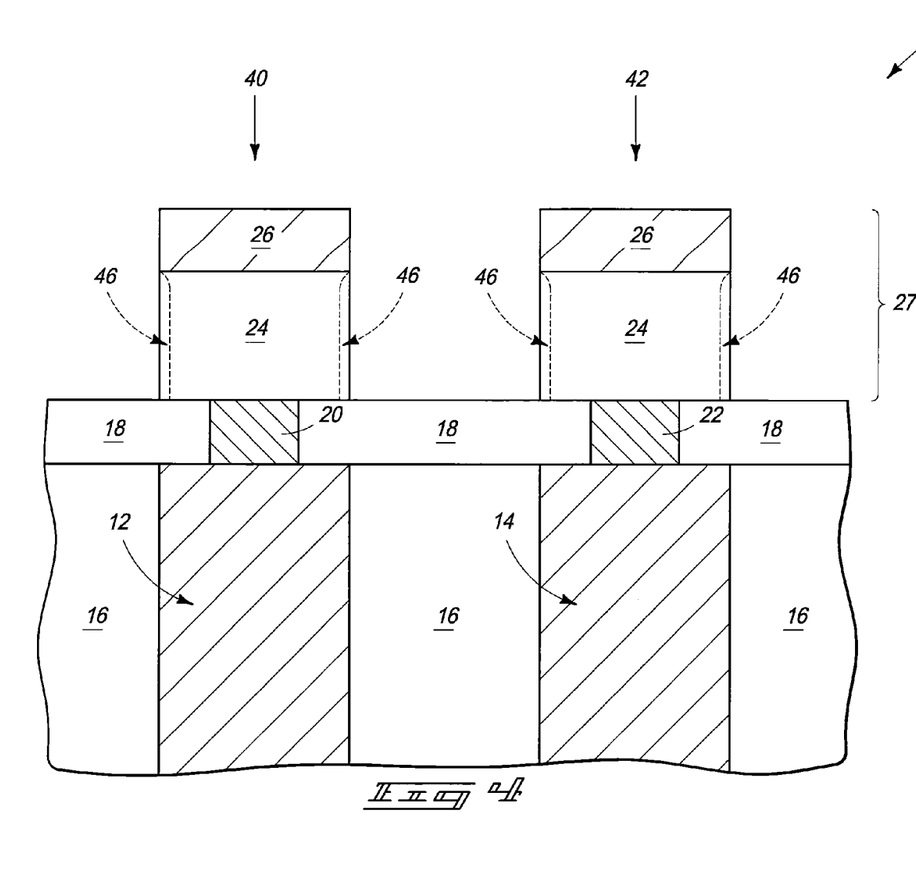

FIG. 4 shows construction 10 at a processing stage subsequent to removal of sacrificial material 28 (FIG. 3), and shows that such removal has also led to the removal of polymeric material 44 (FIG. 3) from over the memory cell structures 40 and 42. In the shown embodiment, the polymeric material 44 is removed from along sidewalls of structures 40 and 42 as well as from over the tops of the structures during the removal of sacrificial material 28. In other embodiments, the removal of sacrificial material 28 may cause the polymer to be lifted from over the tops of structures 40 and 42, but at least some of the polymeric residue 44 may remain along sidewalls of the structures. Such remaining polymeric residue may be subsequently removed with a treatment utilized to treat the damage regions (such treatment is discussed below), and/or with a subsequent etch.

In some embodiments the sacrificial material 28 (FIG. 3) may consist of silicon nitride formed by deposition at a temperature less than or equal to 300° C. In such embodiments the sacrificial material may be removed with an etch utilizing HF. The HF-containing etch solution may comprise, consist essentially of, or consist of deionized water and HF. The ratio of deionized water to HF may be about 500:1 (volume to volume), with the HF having been at a concentration of from about 48.8-49.2 (wt. %) prior to the dilution with the deionized water. The HF-containing etch solution may be used at about room temperature (about 22° C.), and the exposure of construction 10 to such etch solution may be for a time of less than about 5 minutes (for instance, a time of from about 2 minutes to about 4 minutes). After the exposure to the HF-containing etchant, the construction 10 may be rinsed with deionized water to remove the etchant.

Figure 5:
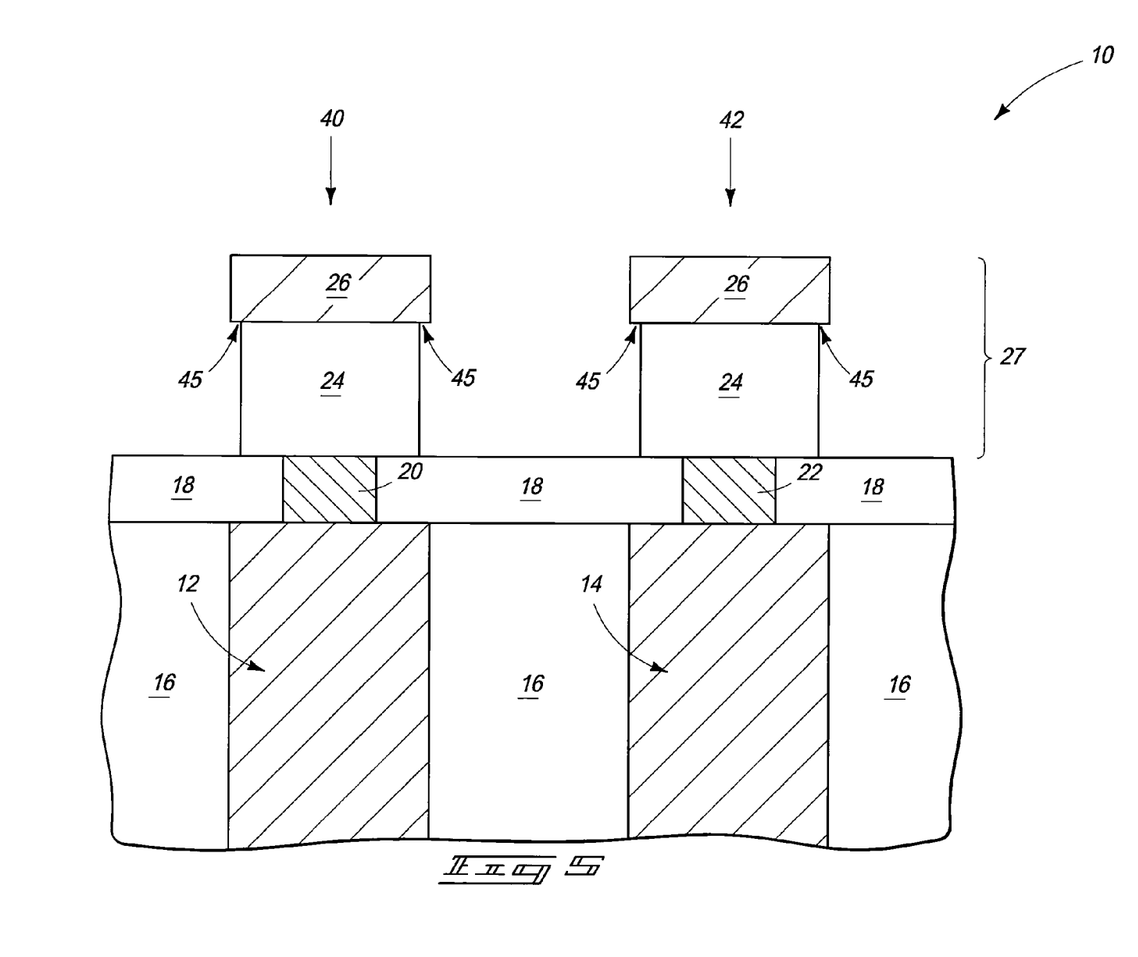

After the polymeric material 44 (FIG. 3) is removed from over structures 40 and 42, the damage regions 46 may be treated to remove such damage regions. FIG. 5 shows construction 10 at a processing stage subsequent to removal of the damage regions 46 (FIG. 4). The treatment utilized to remove the damage regions may comprise exposure of the sidewalls of structures 40 and 42 to one or more oxidants. In some embodiments the treatment may comprise exposure of the sidewalls to one or both of hydrogen peroxide ($H_2O_2$) and nitric acid ($HNO_3$). For instance, a treatment solution may comprise, consist essentially of, or consist of deionized water and $H_2O_2$. The ratio of deionized water to $H_2O_2$ may be from about 1:1 (volume to volume) to about 20:1, with the $H_2O_2$ having been at a concentration of about 30 (wt %) prior to the dilution with the deionized water. The $H_2O_2$-containing treatment solution may be used at about room temperature (about 22° C.), and the exposure of construction 10 to such treatment solution may be for a time of less than about 5 minutes (for instance, a time of from about 2 minutes to about 4 minutes). As another example, a treatment solution may comprise, consist essentially of, or consist of deionized water and $HNO_3$. The ratio of deionized water to $HNO_3$ may be from about 100:1 (volume to volume) to about 100:20. The $HNO_3$-containing treatment solution may be used at about room temperature (about 22° C.), and the exposure of construction 10 to such treatment solution may be for a time of less than about 5 minutes (for instance, a time of from about 2 minutes to about 4 minutes).

An advantage of utilizing hydrogen peroxide for treatment of the damage regions 46 (FIG. 4) is that the hydrogen peroxide-containing treatment solution may be somewhat selflimiting relative to the removal of the damage regions. Specifically, there can be selectivity of the hydrogen peroxide-containing treatment solution for removal of damage regions relative to non-damaged regions, and such can be advantageous in some embodiments.

The construction of FIG. 5 shows that the removal of the damage regions 46 (FIG. 4) can lead to the sidewall edges of phase change material 24 being inset relative to the sidewall edges of top electrode material 26 within the memory cell structures 40 and 42. Accordingly, ledges 45 of the top electrode material 26 extend outwardly beyond sidewall edges of phase change material 24 in the structures 40 and 42 of FIG. 5.

The processing of FIGS. 1-5 advantageously removes the polymeric residue (shown as residue 44 in FIG. 3) and the damaged regions of phase change material (shown as damage regions 46 in FIG. 3). In the shown embodiment the polymeric residue is removed prior to treatment of the damage regions, which is typically the order in which such two steps are conducted. However, it may be possible to reverse the order of the two steps in some embodiments. The chemistry utilized to remove the polymeric residue may be referred to as a first chemistry, and the chemistry utilized to treat the sidewalls may be referred to as a second chemistry. The terms "first" and "second" are utilized as labels to distinguish the two chemistries from one another, and do not imply a particular ordering of the chemistries.

Figure 6:
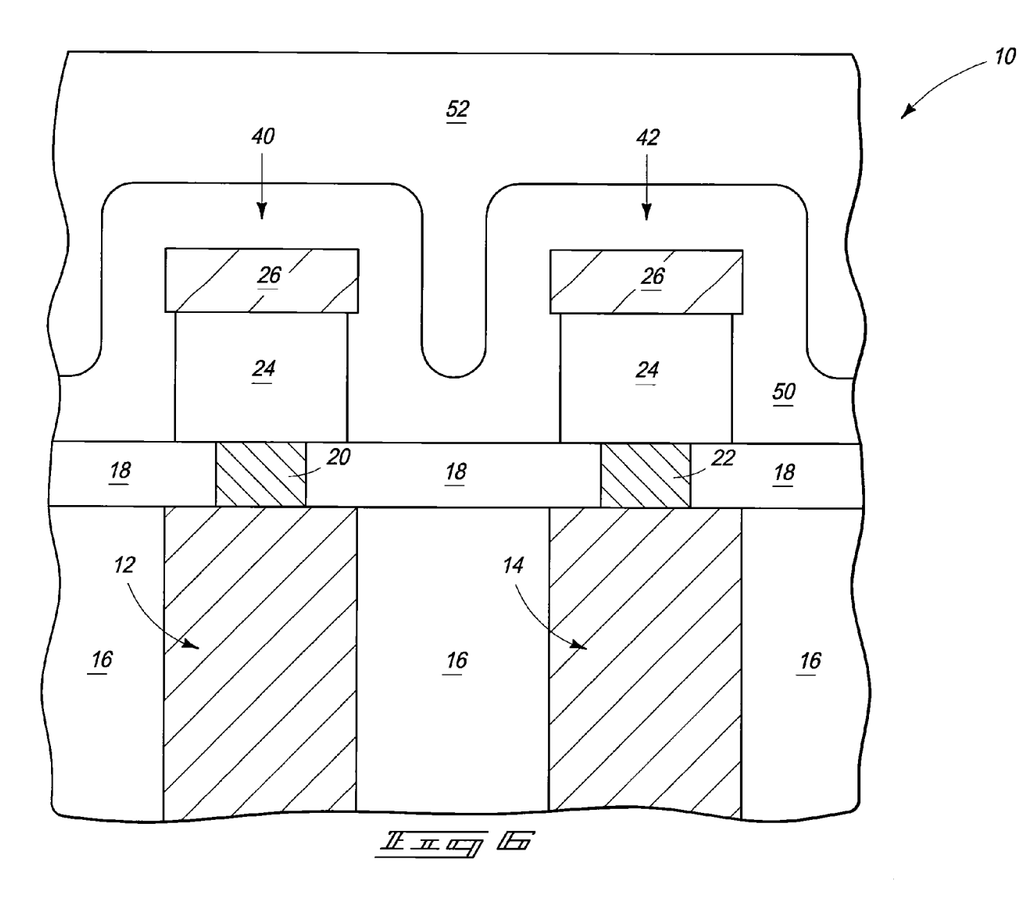
Figure 7:
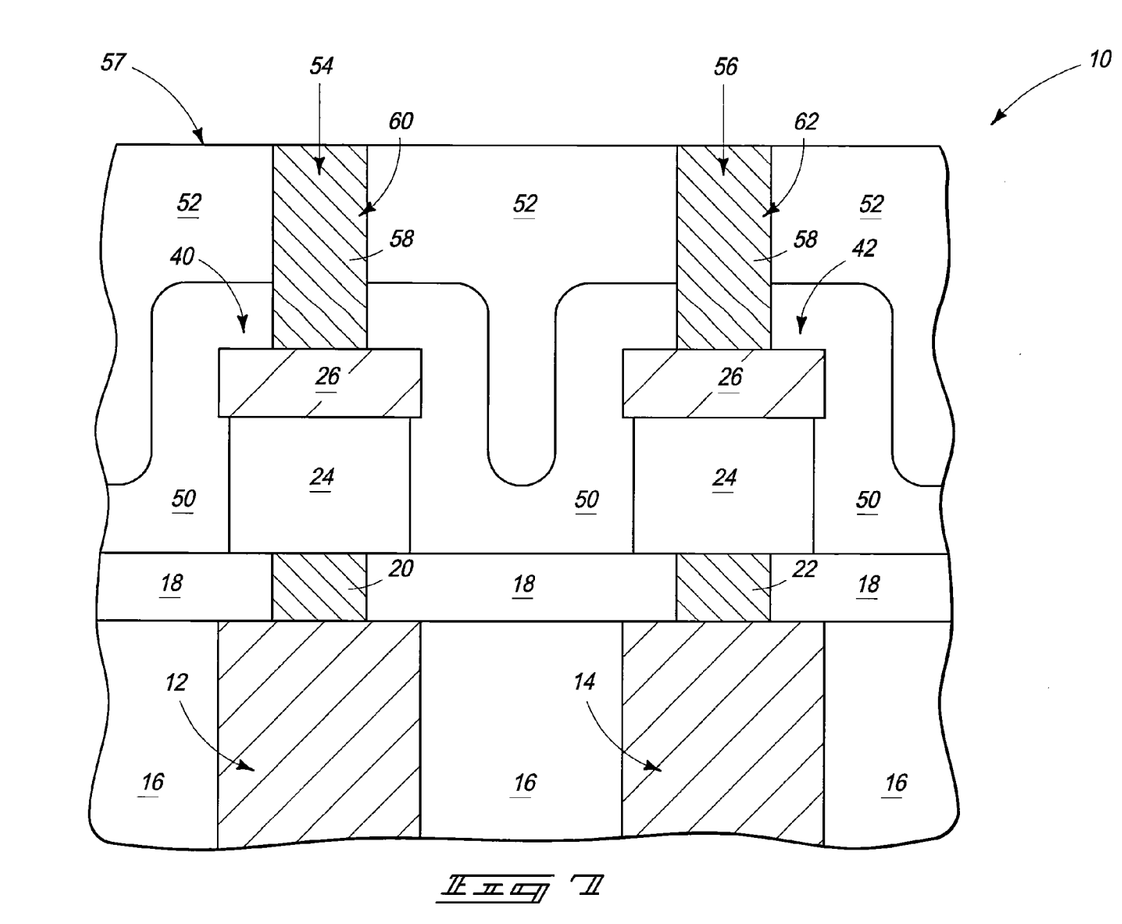

The memory cell structures 40 and 42 of FIG. 5 may be subsequently incorporated into memory cell arrays by electrically connecting the top electrodes of the memory cell structures to appropriate circuitry. FIGS. 6 and 7 show an example method for forming electrical connection to the top electrodes.

Referring to FIG. 6, a passivation material 50 is formed over and between memory cell structures 40 and 42. The passivation material may protect exposed sidewalls of phase change material 24 from oxidation. The passivation material may comprise any suitable composition or combination of compositions, and in some embodiments may comprise, consist essentially of, or consist of silicon nitride. Such silicon nitride may be formed at a temperature of less than or equal to 300° C. The low temperature may be utilized for formation of the silicon nitride due to thermal sensitivity of some phase change materials.

Electrically insulative material 52 is formed over the phase change material. Material 52 may comprise any suitable composition or combination of compositions, and in some embodiments may comprise, consist essentially of, or consist of doped and/or undoped oxide (for instance, BPSG, PSG, FSG, oxide formed from TEOS, etc.).

Referring to FIG. 7, openings 54 and 56 are patterned through materials 50 and 52, and subsequently such openings are filled with electrically conductive material 58.

The openings 54 and 56 may be formed by any suitable methodology. For instance, a photolithographically-patterned photoresist mask (not shown) may be provided over insulative material 52 to define locations of openings 54 and 56, one or more etches may be utilized to form the openings, and then the photoresist mask may be removed.

The conductive material 58 may comprise any suitable composition or combination of compositions, and in some embodiments may comprise, consist essentially of, or consist of one or more of various metals, metal-containing compounds, and conductively-doped semiconductor materials. The conductive material 58 may be formed within the openings utilizing any suitable processing. In some embodiments the conductive material extends across an upper surface of material 52 as well as within openings 54 and 56. The conductive material may be subsequently removed from over material 52 utilizing planarization (for instance, chemical-mechanical polishing) to leave the structure shown in FIG. 7.

The conductive material 58 forms a first electrical interconnect 60 extending to the top electrode material 26 of memory cell structure 40, and forms a second electrical interconnect 62 extending to the top electrode material 26 of memory cell structure 42. Interconnects 60 and 62 may be utilized for electrically connecting the memory cell structures to appropriate circuitry to incorporate such memory cell structures into a memory array.

The embodiments discussed above may be utilized to form memory cells of integrated circuitry. The integrated circuitry may be subsequently utilized in any of numerous electronic systems. Example electronic systems are computers, cars, airplanes, clocks, cellular phones, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming memory cells, comprising:
  forming metal-containing bottom electrodes over a semiconductor substrate;
  forming chalcogenide over the bottom electrodes, the chalcogenide comprising Ge and Sb;
  forming top electrode material over the chalcogenide;
  forming silicon nitride over the top electrode material, the silicon nitride being formed at a temperature of less than or equal to about 300° C.;
  etching through the silicon nitride, top electrode material and chalcogenide to form spaced apart memory cell structures, each of said structures having a cap of the silicon nitride thereover; the etching forming polymeric residue over the silicon nitride caps and along sidewalls of the spaced apart structures, and damaging chalcogenide along sidewalls of the structures;

removing at least some of the polymeric residue with a solution comprising HF; and after removing said at least some of the polymeric residue, treating the sidewalls of the structures with one or both of $H_2O_2$ and $HNO_3$ to remove damaged chalcogenide from said sidewalls.

2. The method of claim 1 wherein the removing of at least some of the polymeric residue comprises exposure to the HF for a time of less than or equal to about 5 minutes.

3. The method of claim 1 wherein the treating of the sidewalls is conducted for a time of less than or equal to about 5 minutes.

4. The method of claim 1 wherein the treating of the sidewalls utilizes the $H_2O_2$.

5. The method of claim 1 wherein the treating of the sidewalls utilizes the $HNO_3$.

6. The method of claim 1 wherein the chalcogenide comprises Ge, Sb and Te.

7. The method of claim 1 wherein the chalcogenide consists of $Ge_2Sb_2Te_5$.

* * * * *